(12) United States Patent
Cugalj et al.

(10) Patent No.: US 6,646,197 B1
(45) Date of Patent: Nov. 11, 2003

(54) HIGH PERFORMANCE EMI SHIELD FOR ELECTRONIC EQUIPMENT

(75) Inventors: Darko Cugalj, Nepean (CA); Paul Przybycien, Gloucester (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/562,624

(22) Filed: May 2, 2000

(51) Int. Cl.[7] .................................................. H05K 9/00
(52) U.S. Cl. ........................ 174/35 MS; 174/35 R; 454/184; 361/800
(58) Field of Search .................. 174/35 R, 35 MS, 174/35 GC; 361/816, 818, 800; 454/184

(56) References Cited

U.S. PATENT DOCUMENTS 6,252,161 B1 * 6/2001 Hailey et al. ............. 174/35 R
6,285,548 B1 * 9/2001 Hamlet et al. .............. 361/695
6,362,417 B2 * 3/2002 Mitchell et al. ........ 174/35 GC
6,426,459 B1 * 7/2002 Mitchell ................ 174/35 MS

FOREIGN PATENT DOCUMENTS

EP    WO 93/15595    *  8/1993

OTHER PUBLICATIONS

John Corden, et al., "Honeycomb Structure" pp. 721–728. No date.

* cited by examiner

Primary Examiner—Hung V. Ngo

(57) ABSTRACT

The present invention relates to an electronic module which has a honeycomb material held within a solid metal frame as the top and bottom of the module. This structure provides increased capacity for convective cooling and increased electromagnetic radiation shielding over previous options.

26 Claims, 9 Drawing Sheets

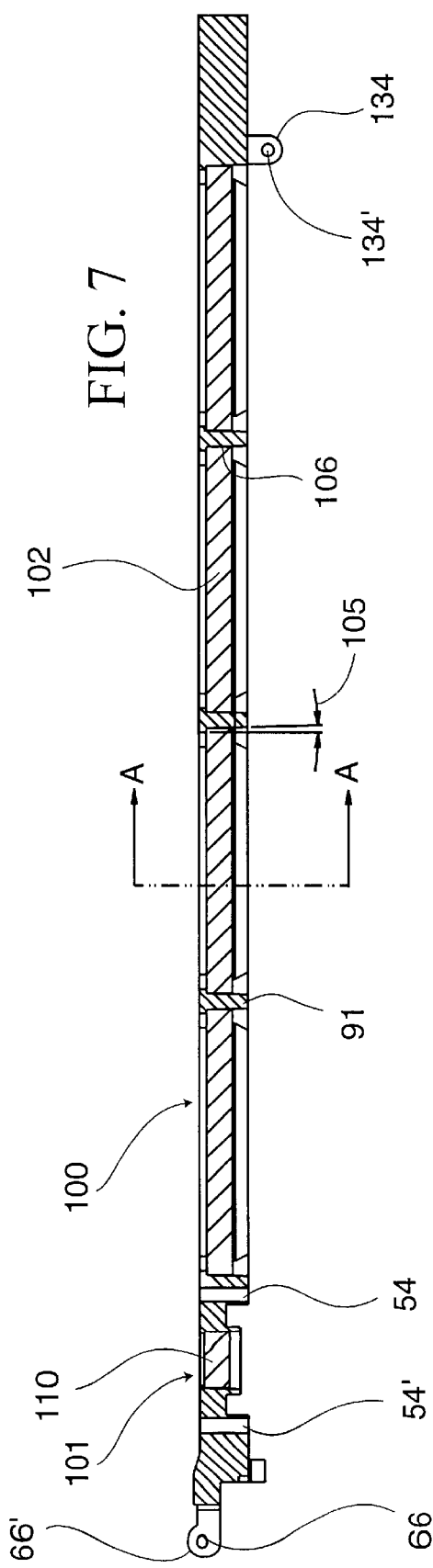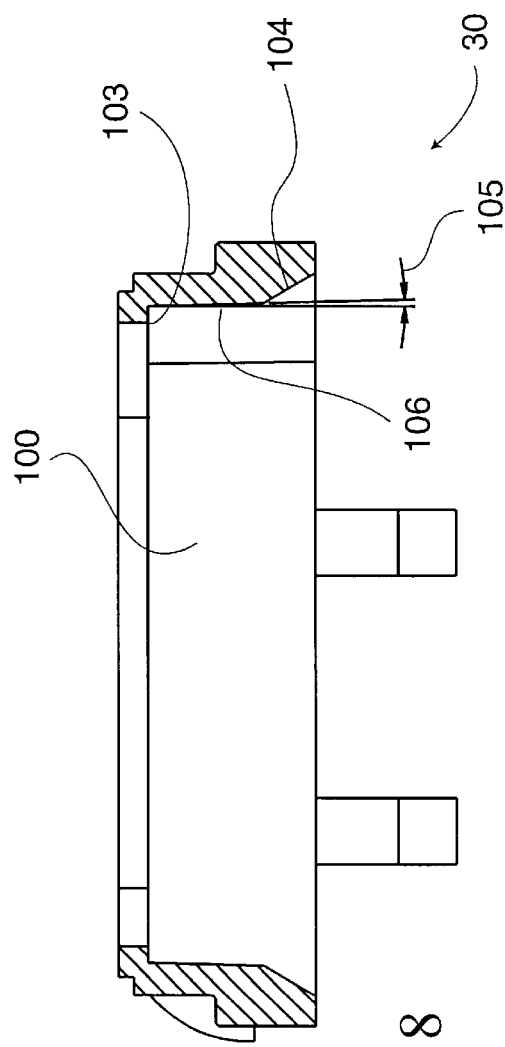

HIGH PERFORMANCE EMI SHIELD FOR ELECTRONIC EQUIPMENT

FIELD OF THE INVENTION

This invention relates generally to the control of electromagnetic radiation and more particularly to enclosures to provide shielding of electromagnetic interference (EMI).

BACKGROUND OF THE INVENTION

Electronic components generate both electromagnetic radiation and thermal energy (heat) when operated. The electromagnetic radiation can hinder electromagnetic compatibility (EMC) of a system by creating EMI. EMI hampers the operation of other electronic components which are mounted on the same printed circuit board (PCB) or are mounted on other PCBs within the same electronic enclosure. Similarly, the heat generated by the operation of a component can hamper the operation of the component itself or other components.

The most common manner of cooling components is to use convection, that is, to cool the components by blowing air across the surface of the components. Where a PCB is installed in an electronic enclosure, the airflow is provided by fans mounted perpendicular to the PCB.

Various ways have been developed to shield other components from the EMI produced by a component.

One method of providing EMI shielding is to encase a component within a sheet metal box. The component is first soldered in place on the PCB. A sheet metal box, which is slightly larger than the component and has a top and four sides, is placed over the component and soldered to the PCB. There are difficulties with this solution. First, if the component is a high power component, i.e. it generates significant thermal energy, the sheet metal box prevents the component from being directly cooled by convection. The convective air impacts only on the sheet metal box and not on the component itself. Second, if the component is thought to be defective during testing or in operation, it is necessary to unsolder the sheet metal box in order to trouble shoot the component.

Another method of providing EMI shielding is to create an electronic module by encasing the front, top, bottom and sides of a PCB in a sheet metal box. To enable convective cooling of the components, the top and bottom sheet metal pieces have holes punched or drilled through them. However, there are limitations to such a structure. First, the amount of open area which can be generated by this method does not enable sufficient airflow to cool high power components. Second, sheet metal with holes does not provide sufficient EMI shielding.

Where an electronic system which is generating electromagnetic energy is large, it is known to provide EMI shielding by placing the electronic system in a box the sides of which consist of a metal formed to have honeycomb openings through it (honeycomb material). The metal provides EMI shielding while the honeycomb openings enable airflow.

In such applications, the sides of the box are held together in a sheet metal frame. To create the sheet metal frame, a piece of sheet metal is bent over the edges of the box thereby covering a portion of the honeycomb openings. The overlap of the sheet metal frame over the sides of the box must be sufficiently large in size to support the box.

This structure is acceptable for large enclosures because the percentage of honeycomb openings which are covered by the sheet metal frame is insignificant. However, where the enclosure is small, an unacceptably large percentage of the honeycomb openings are covered by the sheet metal frame preventing the desired airflow.

SUMMARY OF THE INVENTION

The present invention provides an electronic module which has increased capacity for convective cooling and increased EMI shielding relative to previous options. To achieve these advantages, the present invention uses a honeycomb material held within a solid metal frame for the top and the bottom of an electronic module. The term solid metal frame is used to refer to a frame which is machined from a block of metal or is cast metal. The resulting frame is stronger and can be made thicker while still being manufactured to tighter tolerances than a frame which is formed from bending sheet metal. It can therefore be designed to minimize the lateral area covered by the frame and to hold the honeycomb material with a very small lip or no lip. This maximizes the size of the openings and minimizes the overlap of the frame on the honeycomb material thereby maximizing the exposed honeycomb openings. The result is that the honeycomb material held in a solid metal frame may be used to provide combined EMI shielding and airflow in smaller areas than honeycomb material could previously be used, in particular in the top and the bottom of a module.

Advantageously, the small hole size and greater thickness of the honeycomb material offers higher EMI shielding than a drilled or punched metal sheet. Another advantage of the structure of the present invention is that the honeycomb material has more open spaces for airflow than a drilled or punched sheet metal.

The invention may be summarized according to a first broad aspect as a module for enclosing electronic systems which generate electromagnetic radiation and thermal energy comprising: an electrically conductive metal front, an electrically conductive metal left side mechanically and electrically connected to said front, an electrically conductive metal right side mechanically and electrically connected to said front, a rear opening, a top frame of electrically conductive solid metal which is mechanically and electrically connected to said front, said left side and said right side, said top frame having at least one opening, electrically conductive honeycomb material received in and substantially filling the at least one opening in said top frame and being mechanically and electrically connected to said top frame, a bottom frame of electrically conductive solid metal which is mechanically and electrically connected to said front, said left side and said right side, said bottom frame having at least one opening, and electrically conductive honeycomb material received in and substantially filling the at least one opening in said bottom frame and being mechanically and electrically connected to said bottom frame, whereby the honeycomb material provides electromagnetic radiation shielding while permitting airflow therethrough.

The invention may be summarized according to a second broad aspect as a frame and honeycomb assembly for use with a module comprising: a frame of electrically conductive solid metal, and electrically conductive honeycomb material received in and substantially filling an at least one opening in said frame and being mechanically and electrically connected to the said frame, whereby the honeycomb material provides electromagnetic radiation shielding while permitting airflow therethrough.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Preferred embodiments of the invention will now be described with reference to the attached drawings in which:

FIG. 7 depicts a cross-section, drawn to an enlarged scale, of the top honeycomb of FIG. 5;

FIG. 8 depicts a cross-section, drawn to an enlarged scale, along lines A—A of FIG. 7;

DETAILED DESCRIPTION OF THE EMBODIMENT

Figure 1:
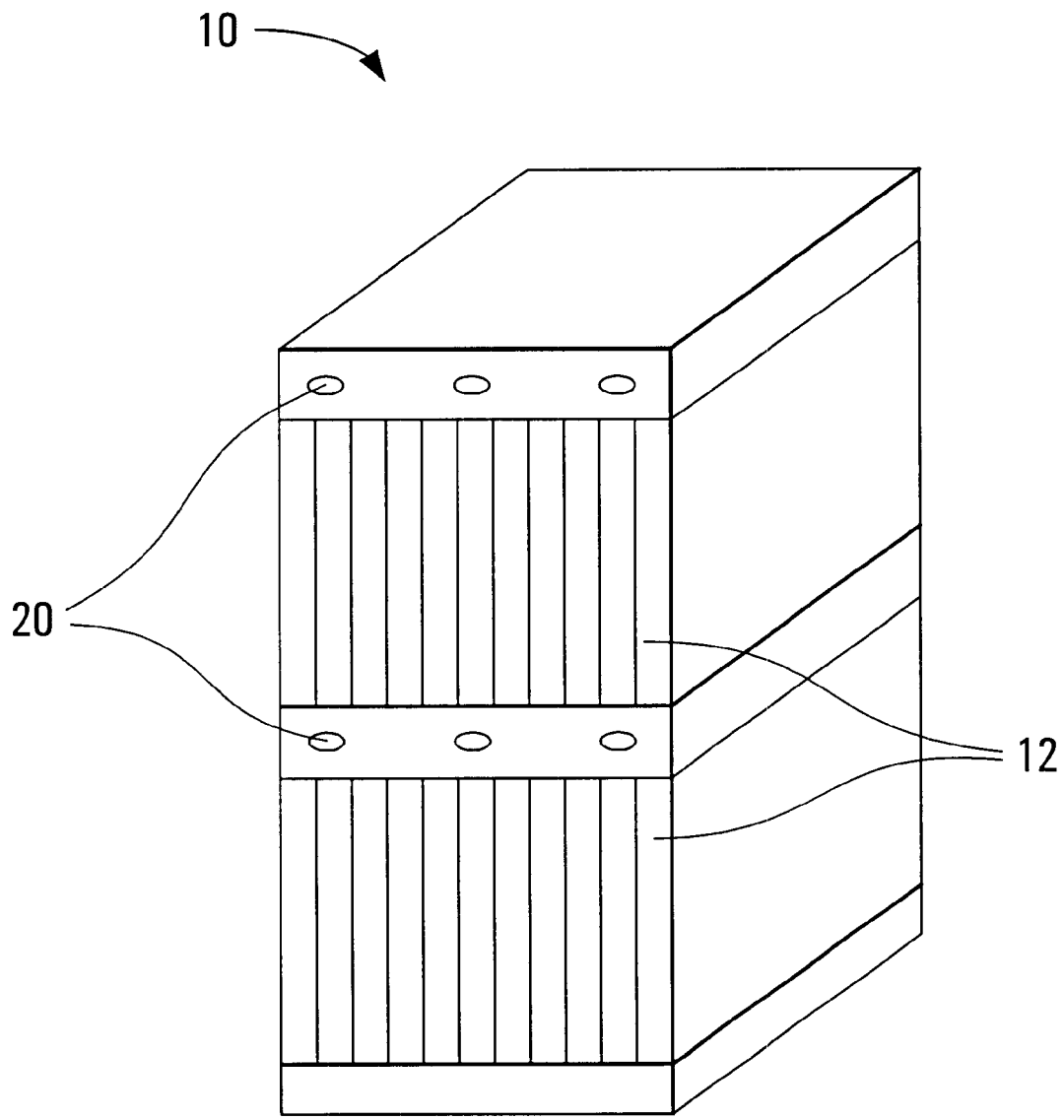
FIG. 1 depicts an electronic enclosure.

FIG. 1 shows an electronic enclosure 10, which may be part of a telephone switching system, which has a plurality of electronic modules 12 arranged in two stacked rows. Each of the modules 12 rests on a support rail (not shown) and is plugged into a back plane connector (not shown) which is mechanically mounted on and electrically connected to a back plane (not shown) at the rear of electronic enclosure 10. The back plane connector operates to shield electromagnetic radiation from being emitted from the rear of the module.

The electronic enclosure also has a plurality of fans 20 mounted in two rows in electronic enclosure 10 above the two rows of the plurality of modules 12. In operation, each row of fans 20 blows air down from the top of each of the respective rows of modules 12. The maximum width of each of the modules 12 is limited by the width of electronic enclosure 10 which is generally standard for a given producer and is limited by the space available where the electronic enclosure 10 is installed.

Figure 2:
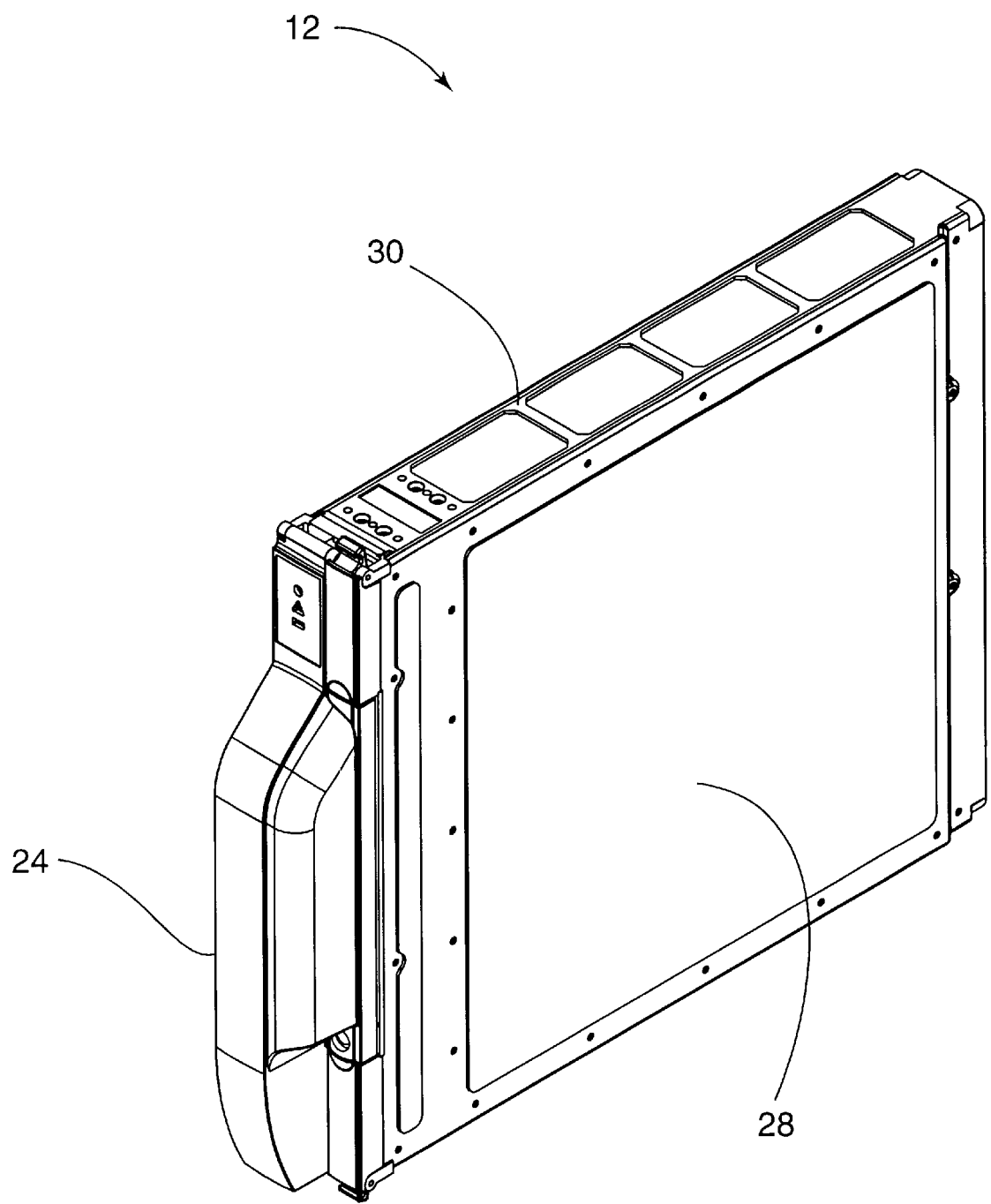
FIG. 2 depicts an electronic module in accordance with an embodiment of the present invention.

FIG. 2 provides a front perspective view of an electronic module 12. Module 12 has a fiber hood 24, a left cover 26 (not visible in this figure), a right cover 28, a top honeycomb 30 and a bottom honeycomb 32 (not visible in this figure). Left cover 26 and right cover 28 are formed of a conductive sheet metal such as steel. Both left cover 26 and right cover 28 are rectangular. Fiber hood 24 is composed of a molded polymer with a conductive coating.

Figure 3:
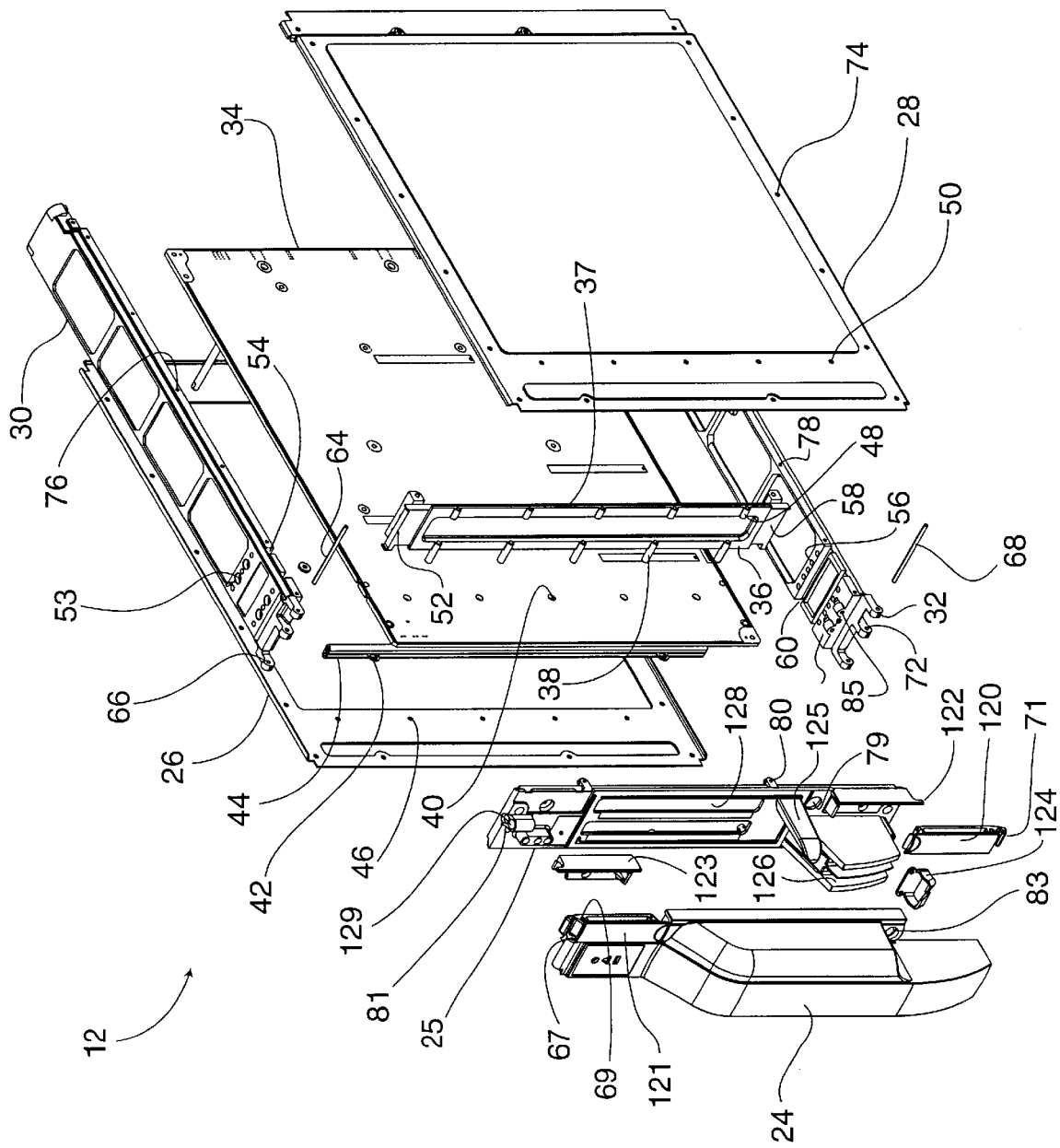
FIG. 3 depicts a front exploded view of the module of FIG. 2.

FIG. 3 depicts an exploded view of the interior of electronic module 12. For clarity, screws have been omitted from FIGS. 3 through 8. Inside electronic module 12 is at least one PCB 34. Mechanically mounted on and electrically connected to PCB 34 is a plurality of electronic components and fiber optic components (not shown) at least some of which generate electromagnetic radiation and heat. At least some of the fiber optic components are mechanically and optically connected to a plurality of fiber optic cables (not shown). Although a PCB is described, the module may equally contain other electronic systems.

The elements of electronic module 12 are interconnected as follows. An elongated rectangular wall 36 is formed of solid metal such as nickel plated cast zinc alloy or machined aluminum. Wall 36 has a raised portion 37 onto which are formed a plurality of left posts 38 and a plurality of right posts 48. The left posts 38 are inserted through a plurality of holes 40 in PCB 34, then through eyelets 42 in a gasket spacer 44 and are aligned with a plurality of holes 46 in left cover 26. The plurality of left posts 38 are internally threaded such that screws can be inserted through holes 46 in left cover 26 and screwed into left posts 38 to retain PCB 34 parallel to left cover 26 and right cover 28. Similarly, right posts 48 are internally threaded and are aligned with a plurality of holes 50 in right cover 28 and retained in that position by a plurality of screws inserted through holes 50 and screwed into right posts 48.

A top 52 of wall 36 is slid into a slot 54 of top honeycomb 30 and is retained in this position by screws which are screwed through recessed holes 53 in top honeycomb 30 and holes (not shown) in wall 36. Similarly, a bottom 58 of wall 36 is slid into a slot 60 of bottom honeycomb 32 and is retained in this position by screws which are screwed through recessed holes 56 in bottom honeycomb 32 and holes (not shown) in wall 36. When assembled, wall 36 divides the interior of module 12 into two regions and acts as an electromagnetic shield between the two regions.

A faceplate 25 is also formed of solid metal such as nickel plated cast zinc alloy or machined aluminum and has an elongated rectangular shape. Faceplate 25 has slots 128, arm 125 and recesses 126. A fiber retainer 124 is screwed to a lower end (not shown) of faceplate 25. Top latch cover 123 and bottom latch cover 122 are fastened to faceplate 25 using locking studs (not shown). When assembled, the plurality of fiber optic cables (not shown) exit the interior of the module 12 through slots 128, extend through the recesses 126 to the left of arm 125 and are retained in position by the fiber retainer 124.

Faceplate 25 is connected to top honeycomb 30 by aligning holes 81 in faceplate 25 with holes 144 (not shown in this figure) in top honeycomb 30 and screwing screws through these aligned holes. Similarly, faceplate 25 is connected to bottom honeycomb 32 by aligning holes (not shown) in faceplate 25 with holes 85 in bottom honeycomb 32 and screwing screws through these aligned holes.

Fiber hood 24 is connected to faceplate 25 by a lock stud 83 inserted through hole 79. Fiber hood 24 and a top latch 121 are connected to top honeycomb 30 by aligning holes 66 in top honeycomb 30 with hole 67 in fiber hood 24 and hole 69 in top latch 121 and then inserting a pin 64 through the aligned holes. Plunger 129 interfaces with the resulting connection to allow fiber hood 24 to be held open. Bottom latch 120 is connected to bottom honeycomb 32 by aligning holes 72 in bottom honeycomb 32 with hole 71 in bottom latch 120 and then inserting a pin 68 through the aligned holes.

Right cover 28 is connected to top honeycomb 30, bottom honeycomb 32 and faceplate 25 by screws inserted into the perimeter holes 74 of right cover 28 which now align with holes 76 in an edge of top honeycomb 30, holes 78 in an edge of bottom honeycomb 32 and holes 80 in an edge of the faceplate 25. Left cover 26 is connected to top honeycomb 30, bottom honeycomb 32 and faceplate 25 in the same manner.

Figure 4:
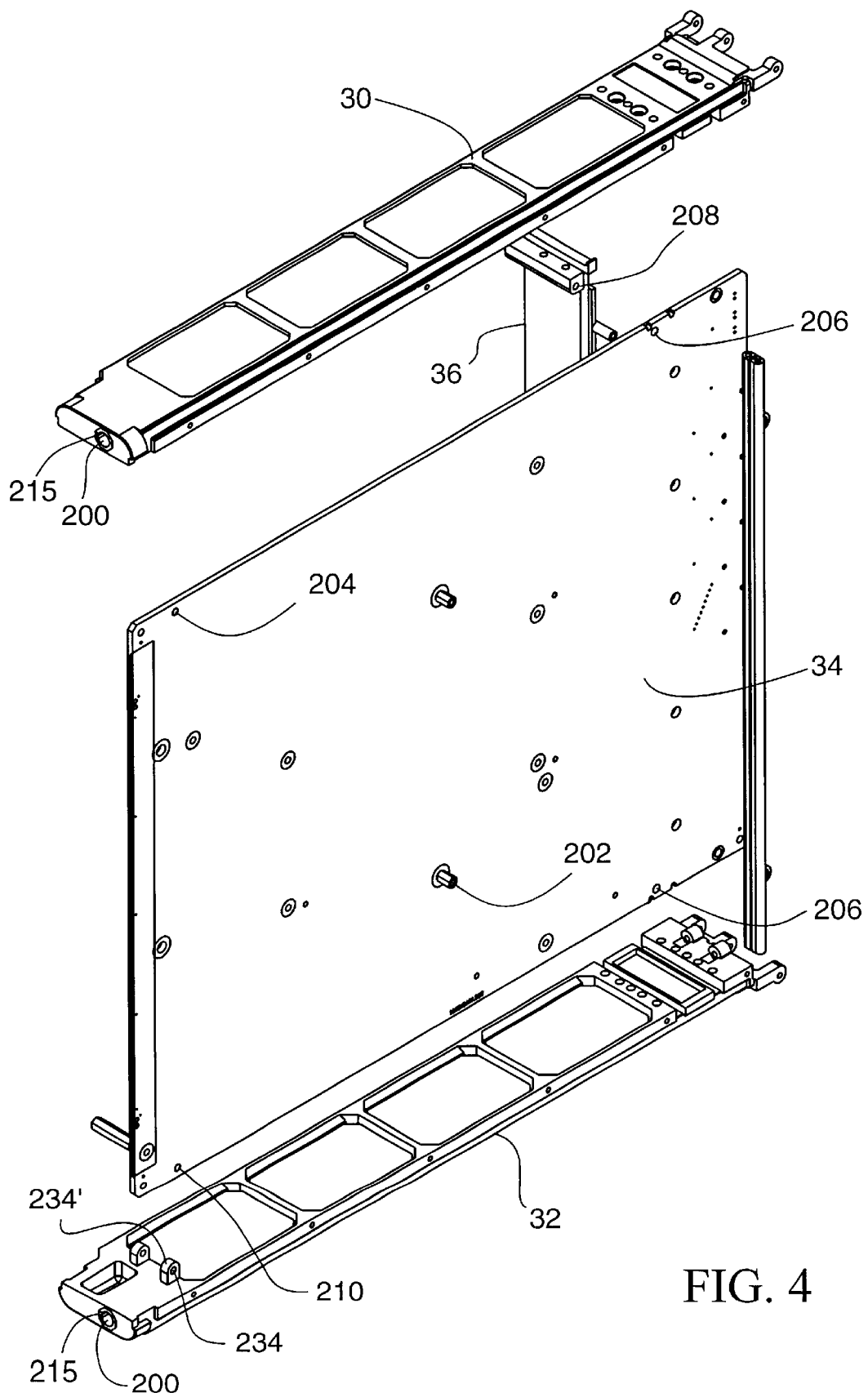
FIG. 4 depicts a rear exploded view of portions of the interior of the module of FIG. 2.

FIG. 4 depicts an exploded rear perspective view of portions of the interior of electronic module 12. FIG. 4 depicts further detail of how PCB 34 is retained in electronic module 12. In particular, holes 206 in PCB 34 are aligned with holes 208 in wall 36 (lower hole is not shown) and screws are screwed through the aligned holes. At the same time, hole 210 is aligned with hole 234 in projecting portion 234' and screws are screwed through the aligned holes. Hole 204 is aligned with and screwed to top honeycomb 30 in a similar manner. A plurality of standoffs 202 are screwed to PCB 34 and help to maintain PCB 34 at a fixed location within module 12. Receptacle 215 at the rear of top honeycomb 30 and bottom honeycomb 32 houses a recessed c-shaped alignment key 200 which is used to align and key module 12 into electronic enclosure 10.

Figure 5:
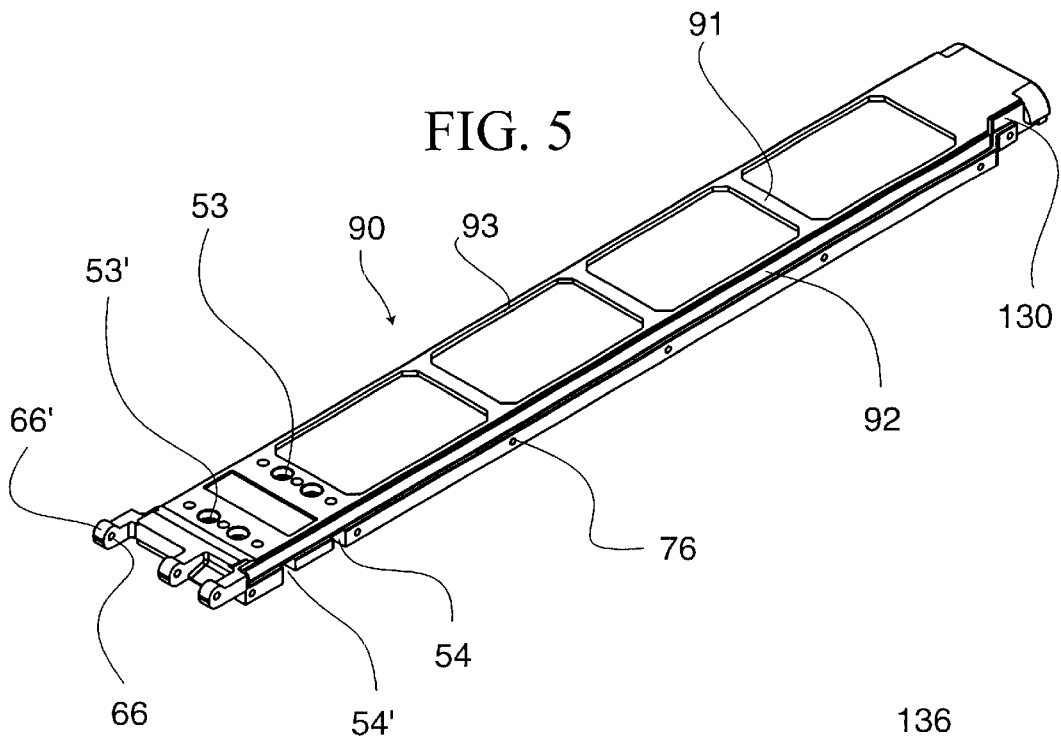
FIG. 5 depicts a perspective top view of a top honeycomb in accordance with an embodiment of the present invention.
Figure 6:
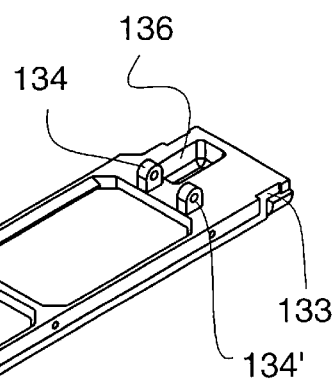
FIG. 6 depicts a perspective bottom view of the top honeycomb in accordance with an embodiment of the present invention.

Top honeycomb 30 and bottom honeycomb 32 are substantially identical. The only difference between them is that they are mirror images of each other. Therefore, only top honeycomb 30 will be described in detail. FIG. 5 depicts a top view of a frame 90 of top honeycomb 30 and FIG. 6 depicts a bottom view of frame 90 of top honeycomb 30. Frame 90 is a solid conductive metal frame of machined or cast metal. The metal may, for example, be cast zinc alloy (which is later plated with nickel), or machined aluminum, steel, or copper. This is in contrast to forming frame 90 by bending sheet metal. The casting and machining manufacturing processes produce a stronger frame which can also be thicker and still be manufactured to more accurate dimensions than those to which sheet metal is typically bent.

Frame 90 has a much greater length than width. Frame 90 has two elongated members 93 and three cross-members 91 which define four large substantially rectangular openings 100. Cross-members 91 are slightly wider adjacent to holes 76 so that there is sufficient material to support screws when they are inserted into holes 76. Frame 90 also defines a small rectangular opening 101 between the slot 54 and a slot 54'.

As previously described, slot 54 receives top 52 of wall 36 and wall 36 is connected to frame 90 by screws inserted through recessed holes 53. However, frame 90 is designed to be adapted for use with other modules which require a different positioning of wall 36. For this reason, frame 90 is provided with the second slot 54' and a second set of recessed holes 53' by which wall 36 may be connected to frame 90. Opening 101 is provided between slot 54 and slot 54' in order to provide as much open space as possible in frame 90. Adjacent recessed holes 53 and 53' are additional holes 140 and 142. The purpose of holes 140 and 142 is to maximize airflow through whichever of mounting position of wall 36 is not used.

Frame 90 also has three rounded projecting portions 66' through which are provided aligned holes 66. Projecting portions 66' are spaced to receive top latch 121 and fiber hood 24. As previously described, holes 66 enable connection between top honeycomb 30, fiber hood 24 and top latch 121.

An edge 92, and a rear extension 130, and an edge 94, and a rear extension 133, of frame 90 are slightly recessed and have applied to them an elastomeric conductive gasket (not shown). When the module is assembled, the elastomeric conductive gasket is sandwiched between frame 90 and left cover 26 and right cover 28 thereby providing electrical connection between top honeycomb 30 and left cover 26 and right cover 28.

FIG. 6 also, depicts holes 144 locate in cylindrical projections 145 towards a front of frame 90. Holes 144 are internally threaded and, as previously described, are used to secure top honeycomb 30 to faceplate 25. Towards a rear of frame 90, projecting portions 134 have holes 134' extending through them and are used to secure top honeycomb 30 to PCB 34. Additionally, frame 90 has a recessed portion 136 near the rear of frame 90 which is provided to balance the casting process in this area of frame 90 when frame 90 is formed from cast metal.

FIGS. 7 and 8 depict cross sections of top honeycomb 30. Each rectangular opening of Frame 90 is defined by two pairs of spaced interior surfaces 106. The interior surfaces 106 are not precisely vertical, instead they extend at a 1.50° angle 105 such that the surfaces of each pair of spaced surfaces are slightly further apart at a lower end (as seen in FIGS. 7 and 8) than at an upper end. Frame 90 also has lips 103 which extend over the upper ends of rectangular openings 100 and rectangular opening 101. Lips 103 extend all around each opening and are very small in size relative to rectangular openings 100 and rectangular opening 101. Those interior surfaces 106 located parallel to the length of the frame 90, those surfaces 106 seen in FIG. 8, flare outwardly at their lower ends to form a mouth 104. Mouth 104 subtends a significantly larger angle than interior surfaces 106. A substantially rectangular piece of conductive honeycomb material 102 is inserted into each of rectangular openings 100 and rests against lips 103 of frame 90. Similarly, a substantially rectangular piece of conductive honeycomb material 110 is inserted into rectangular opening 101 and rests against lips 103 of frame 90. Mouths 104 and angles 105 of walls 106 of frame 90 allow the pieces of conductive honeycomb 102 and the piece of conductive honeycomb 110 to slide into openings 100 and opening 101 respectively. Once the pieces of conductive honeycomb 102 and 110 are positioned in openings 100 and opening 101 respectively, a conductive adhesive (not shown) is applied around the perimeter of a top and a bottom of the pieces of conductive honeycomb 102 and 110 to mechanically and electrically connect the pieces of conductive honeycomb 102 and 110 to frame 90.

Because lips 103 are very small relative to the pieces of conductive honeycomb 102 and 110, they do not interfere with the airflow through the pieces of conductive honeycomb 102 and 110. Lips 103 help in the positioning and retaining of the pieces of conductive honeycomb 102 and 110. However, lips 103 are not essential. The conductive adhesive may be used without lips 103 to mechanically and electrically connect the pieces of conductive honeycomb 102 and 110 to frame 90.

Figure 9:
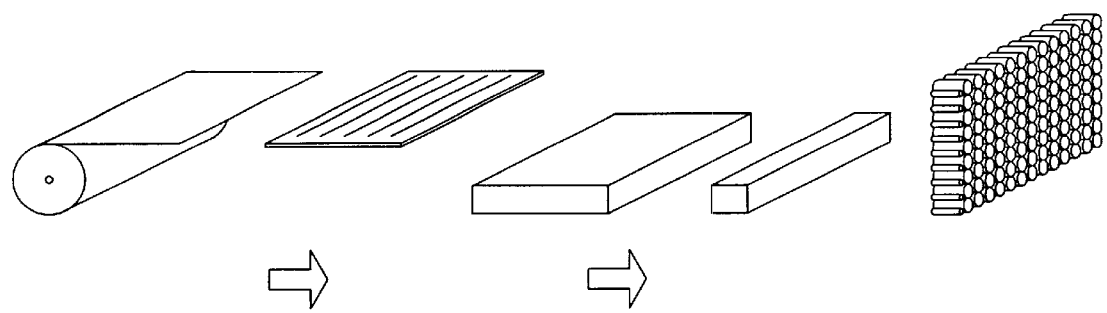
FIG. 9 depicts a method of honeycomb manufacture.

Conductive honeycomb material 102 and 110 consists of thin sheets attached in such a manner as to form connecting cells. FIG. 9 depicts how such material is fabricated. A conductive material (typically 0.030 inches thick) is cut into sheets. The material is preferably an aluminum alloy but may also be corrosion resistant steel, titanium, and nickel based alloys. Where aluminum alloy sheets are used, the sheets are first cleaned and coated with a corrosion resistant treatment. Thin lines of adhesive are then printed onto the sheets of conductive material. The sheets are then stacked such that the adhesive is positioned in a predetermined pattern necessary to achieve a desired honeycomb structure. The number of sheets in the stack is determined by the thickness of honeycomb material required. The resulting stack of sheets is then cured in a press (i.e. subjected to elevated temperature and pressure) to create a block of material. The block of material is cut into slices of desired thickness and then the slice is expanded to open the areas between the lines of adhesive creating a plurality of honeycomb openings in the slice. When the slices are expanded, the individual sheets yield plastically at the joints created by the cured adhesive and retain the expanded honeycomb shape.

Figure 10:
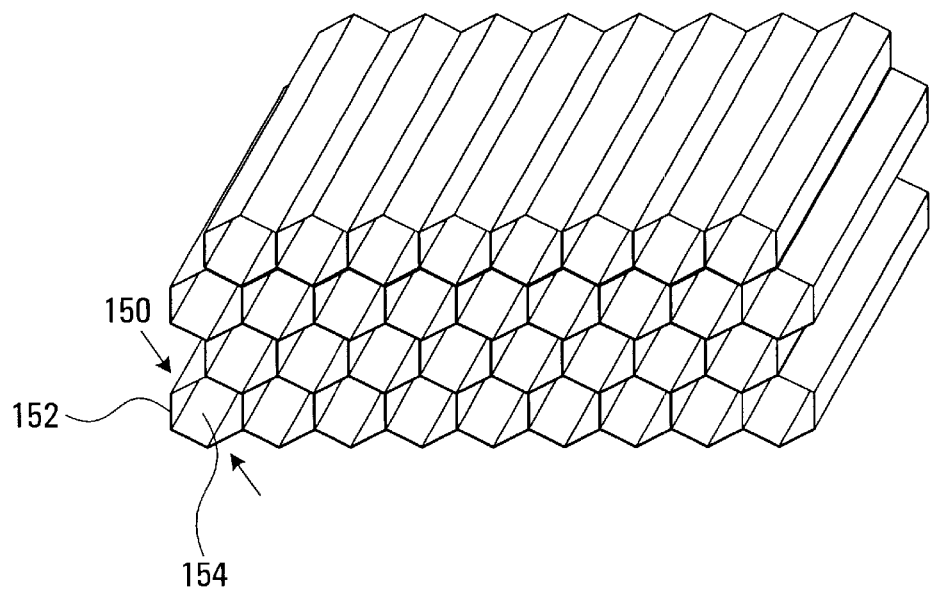
FIG. 10 depicts a conventional honeycomb structure.

FIG. 10 depicts a perspective view of honeycomb material showing cells of individual size 150, each of which comprises side walls 152 and openings 154. The cross-sectional area of the conductive honeycomb material consists of 95% to 99% openings 154 with the remainder of the cross-sectional area being side walls 152.

Figure 11A:
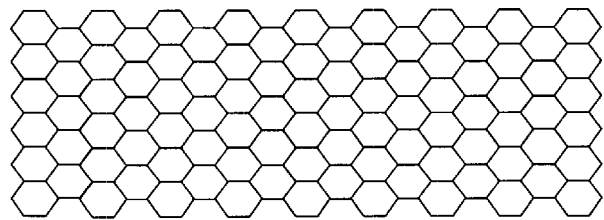
FIGS. 11A–F depicts various alternative honeycomb structures.
Figure 11B:
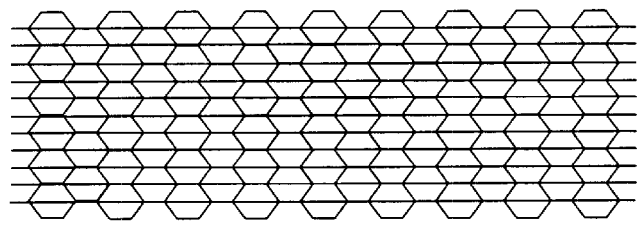
Figure 11C:
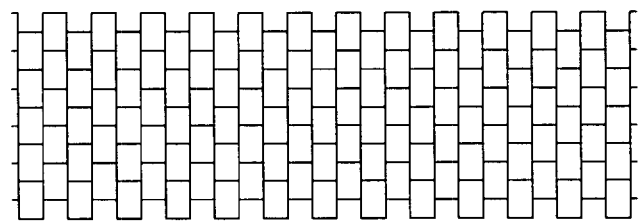
Figure 11D:
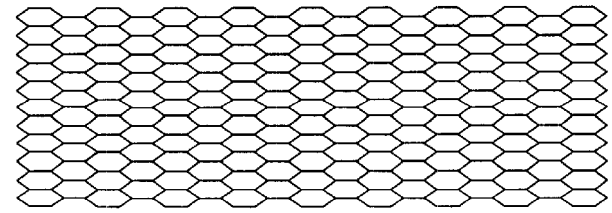
Figure 11E:
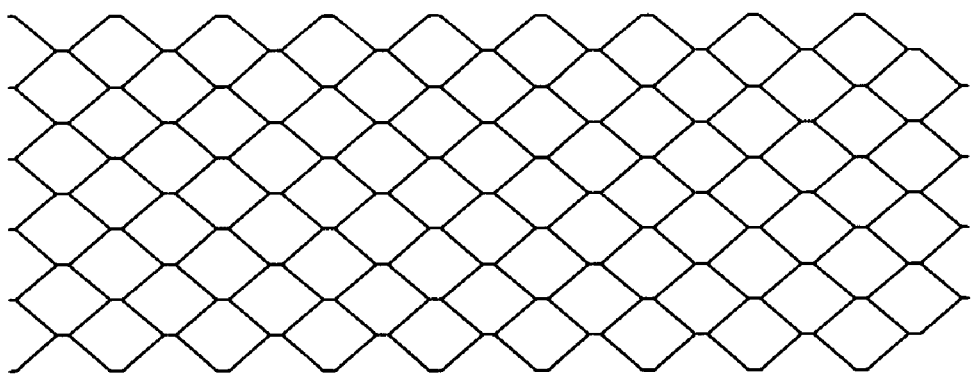
Figure 11F:
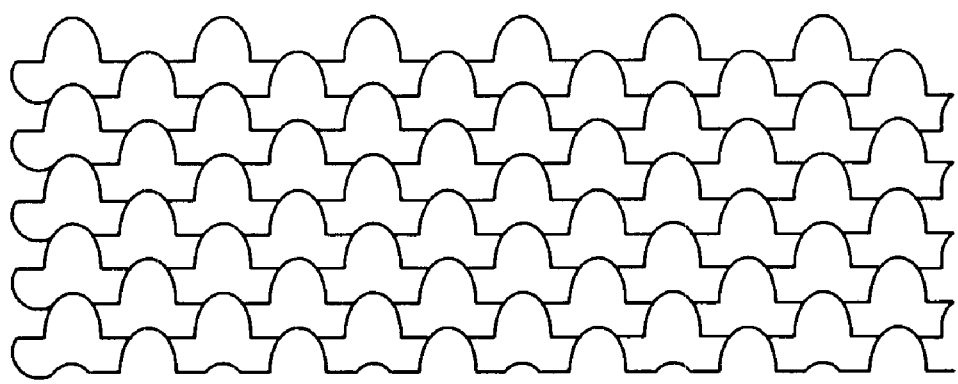

FIGS. 11A to 11F depict a variety of honeycomb openings which can be achieved including the typical hexagonal openings depicted in FIG. 11A.

The smaller the cell used, the higher the frequency of electromagnetic radiation which can be attenuated. The cell sizes available from one supplier, Hexel Corporation, is from 0.06 to 1.0 inches. Table 1 gives the frequency limit for common cell sizes:

TABLE 1

| Cell Size (Inches) | Upper Frequency Attenuated (Gigahertz) |
| --- | --- |
| 1/8 | 23.6 |
| 3/16 | 15.7 |
| 1/4 | 11.8 |
| 3/8 | 7.9 |

The largest cell size should be selected consistent with the highest frequency that must be attenuated. Attenuation levels increase with increasing honeycomb thickness for a given cell size. The thickness is determined based on EMI shielding requirements. Two examples of typical shielding requirements are the shielding of 35 dB at 12.5 GHz and the shielding of 40 dB at 2.5 GHz for both of which the thickness was selected to be 0.125 inches. Low-frequency attenuation performance can be improved by increasing the honeycomb thickness, using a smaller cell size, increasing sheet thickness, or using steel rather than aluminum.

The above description of a preferred embodiment should not be interpreted in any limiting manner since variations and refinements can be made without departing from the spirit of the invention. The scope of the invention is defined by the appended claims and their equivalents.

We claim:

1. A module for enclosing electronic systems which generate electromagnetic radiation and thermal energy comprising:

an electrically conductive metal front, an electrically conductive metal left side mechanically and electrically connected to said front, an electrically conductive metal right side mechanically and electrically connected to said front, a rear opening, a top frame of electrically conductive cast or machined solid metal which is mechanically and electrically connected to said front, said left side and said right side, said top frame having at least one opening, electrically conductive honeycomb material received in and substantially filling the at least one opening in said top frame and being mechanically and electrically connected to said top frame, a bottom frame of electrically conductive cast or machined solid metal which is mechanically and electrically connected to said front, said left side and said right side, said bottom frame having at least one opening, and electrically conductive honeycomb material received in and substantially filling the at least one opening in said bottom frame and being mechanically and electrically connected to said bottom frame, whereby the honeycomb material provides electromagnetic radiation shielding while permitting airflow therethrough.

2. The module of claim 1 wherein the top frame and the bottom frame are formed of nickel plated cast zinc alloy.

3. The module of claim 1 wherein the top frame and the bottom frame are formed of machined aluminum.

4. The module of claim 1 wherein the left side and the right side are formed of steel sheet metal and the front is formed of nickel plated cast zinc alloy.

5. The module of claim 1 wherein the honeycomb material is formed of an aluminum alloy.

6. The module of claim 1 wherein the left side and the right side are formed of steel sheet metal;

the front, the top frame and the bottom frame are formed of nickel plated cast zinc alloy, and the honeycomb material is formed of an aluminum alloy.

7. The module of claim 1 wherein the module encloses a printed circuit board having electronic components mounted thereon and the printed circuit board extends substantially parallel to the left and right sides of the module.

8. The module of claim 7 wherein the module has a wall within the module which divides a face of the printed circuit board into two regions, and whereby said wall shields the electromagnetic radiation generated in each of the two regions from the other region.

9. The module of claim 8 wherein the top frame and the bottom frame are adapted to retain the wall in either of two different positions.

10. The module of claim 1 wherein elastomeric conductive gaskets are sandwiched between said top frame and the left and the right sides and further conductive gaskets are sandwiched between the bottom frame and the left and the right sides.

11. The module of claim 1 wherein the top and bottom frames are substantially identical, each having a length very much greater than its width.

12. The module of claim 1 wherein a cell size of the honeycomb material is in the range ⅛ to 1/32 of an inch.

13. The module of claim 1 wherein the thickness of the honeycomb material is substantially 0.125 inches.

14. The module of claim 1 wherein the top frame and the bottom frame each comprise:

two spaced apart elongated members, said members being interconnected by cross-members to define a plurality of openings, said elongated members and said cross-members having lips which extend into said plurality of openings, said lips having a dimension very much smaller than said openings, and said honeycomb material being located within said openings and retained by said lips.

15. The module of claim 14 wherein said elongated members and said cross-members define interior surfaces of said openings, and said interior surfaces are angled such that the openings are larger at an end away from said lips than they are adjacent said lips, whereby said honeycomb material is inserted into the openings from the end away from said lips.

16. The module of claim 14 wherein said lips extend over said openings is at least 0.030 inches.

17. A frame and honeycomb assembly for use with a module comprising:
   a frame of electrically conductive cast or machined solid metal, and
   electrically conductive honeycomb material received in and substantially filling an at least one opening in said frame and being mechanically and electrically connected to the said frame,
   whereby the honeycomb material provides electromagnetic radiation shielding while permitting airflow therethrough.

18. The frame and honeycomb assembly of claim 17 wherein the frame is formed of nickel plated cast zinc alloy, and the honeycomb material is formed of an aluminum alloy.

19. The frame and honeycomb assembly of claim 17 wherein the frame is formed of machined aluminum.

20. The frame and honeycomb assembly of claim 17 wherein the frame has an elastomeric conductive gasket attached to a left edge and a right edge of said frame.

21. The frame and honeycomb assembly of claim 17 wherein a cell size of the honeycomb material is in the range 1/8 to 1/32 of an inch.

22. The frame and honeycomb assembly of claim 17 wherein the thickness of the honeycomb material is at least 0.25 inches.

23. The frame and honeycomb assembly of claim 17 wherein the frame further comprises:
   two spaced apart elongated members,
   said members being interconnected by cross-members to define a plurality of openings,
   said elongated members and said cross-members having lips which extend into said plurality of openings,
   said lips having a dimension very much smaller than said openings,
   said honeycomb material being located within said openings and retained by said lips.

24. The frame and honeycomb assembly of claim 23 wherein said elongated members and said cross-members define interior surfaces of said openings, and
   said interior surfaces are angled such that the openings are larger at an end away from said lips than they are adjacent said lips,
   whereby said honeycomb material is inserted into the openings from the end away from said lips.

25. The frame and honeycomb assembly of claim 23 wherein said lips extend over said openings is at least 0.030 inches.

26. The frame and honeycomb assembly of claim 17 wherein the frame has a length very much greater than its width.

* * * * *